(12) United States Patent
Bailey et al.

(10) Patent No.: US 7,440,281 B2
(45) Date of Patent: Oct. 21, 2008

(54) THERMAL INTERFACE APPARATUS

(75) Inventors: Sean Ashley Bailey, San Francisco, CA (US); Richard Lidio Blanco, Jr., Santa Clara, CA (US); David Edwards, Poughkeepsie, NY (US); Supratik Guha, Chappaqua, NY (US); Michael David Hillman, Los Altos, CA (US); Yves C. Martin, Ossining, NY (US); Phillip Lee Mort, Santa Clara, CA (US); Roger Schmidt, Poughkeepsie, NY (US); Prabjit Singh, Poughkeepsie, NY (US); Ronald Jack Smith, Foster City, CA (US); Gregory L. Tice, Los Altos, CA (US); Theodore Gerard van Kessel, Millbrook, NY (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 11/344,657

(22) Filed: Feb. 1, 2006

(65) Prior Publication Data
US 2007/0177367 A1    Aug. 2, 2007

(51) Int. Cl.
*H05K 7/20* (2006.01)
(52) U.S. Cl. ............... 361/704; 361/808; 340/97.04
(58) Field of Classification Search ............ 361/808, 361/704; 360/97.02, 97.04
See application file for complete search history.

(56) References Cited

U.S. PATENT DOCUMENTS

| | | | |
|---|---|---|---|
| 4,104,523 A * | 8/1978 | Wolfert | 250/370.02 |
| 4,614,528 A * | 9/1986 | Lennen | 96/147 |
| 4,620,248 A * | 10/1986 | Gitzendanner | 360/97.02 |
| 4,863,499 A * | 9/1989 | Osendorf | 96/134 |
| 4,982,783 A | 1/1991 | Fickett et al. | |
| 5,025,336 A * | 6/1991 | Morehouse et al. | 360/97.02 |
| 5,148,337 A * | 9/1992 | Cullen et al. | 360/97.04 |
| 5,392,177 A * | 2/1995 | Chainer et al. | 360/97.02 |
| 5,440,172 A | 8/1995 | Sutrina | |
| 5,905,636 A | 5/1999 | Baska et al. | |
| 6,143,058 A * | 11/2000 | Dahlgren et al. | 96/13 |
| 6,286,212 B1 | 9/2001 | Eaton | |
| 6,462,410 B1 | 10/2002 | Novotny et al. | |
| 6,504,243 B1 | 1/2003 | Andric et al. | |
| 6,778,387 B2 * | 8/2004 | Fairchild | 361/687 |

(Continued)

FOREIGN PATENT DOCUMENTS

JP    2004-22928    *    1/2004

*Primary Examiner*—Michael C Zarroli
(74) *Attorney, Agent, or Firm*—Dorsey & Whitney LLP

(57) ABSTRACT

An apparatus for conducting heat from a computer component to a heat sink. The invention may include a thermal interface material (TIM). The invention may further include a seal or gasket that at least partially encloses the TIM. The gasket may facilitate retaining the TIM within its sidewall, and thus in place on or near a computer component. Generally, the gasket may be placed between the computer component (or a silicon board or other material upon which the computer component is located) and a heat sink. An insert may be placed within the gasket and define an aperture. The chip seats in the aperture and thus is spatially located with respect to the insert. The TIM abuts both the computer component and a heat sink. A desiccant may be located within the gasket and absorb any moisture diffusing or migrating through the gasket.

38 Claims, 13 Drawing Sheets

U.S. PATENT DOCUMENTS

| | | |
|---|---|---|
| 6,803,328 B2 | 10/2004 | McCullough |
| 6,832,410 B2 | 12/2004 | Hedge |
| 6,886,625 B1 | 5/2005 | Sagal et al. |
| 6,891,724 B2 | 5/2005 | De Lorenzo et al. |
| 6,896,045 B2 | 5/2005 | Panek |
| 6,987,671 B2 | 1/2006 | Houle |
| 7,006,353 B2 | 2/2006 | Matteson |
| 7,045,885 B1 * | 5/2006 | Chen et al. .................. 257/678 |
| 7,085,135 B2 | 8/2006 | Chu et al. |
| 7,125,433 B2 * | 10/2006 | Garikipati et al. .......... 55/385.6 |
| 7,190,585 B2 | 3/2007 | Houle |
| 7,269,015 B2 | 9/2007 | Hornung et al. |
| 2004/0238827 A1 * | 12/2004 | Takayama et al. ............. 257/79 |
| 2006/0120051 A1 | 6/2006 | Macris et al. |
| 2007/0076378 A1 * | 4/2007 | Blanco, Jr. .................. 361/719 |

* cited by examiner

THERMAL INTERFACE APPARATUS

BACKGROUND OF THE INVENTION

1. Technical Field

The present invention relates generally to computer systems and components, and more particularly to a thermal interface apparatus for facilitating heat transfer from a computer component.

2. Background Discussion

Processors (also referred to as "computer processors" or "processor chips") are specialized electronic circuits providing computing functionality in a variety of modern electronics, such as computers or other computing devices, networking devices, and/or telecommunications devices. Processors ("chips") may be responsible for the overall operation of a computing, telecommunications, or network device (such as a central processing unit, router or switch), operation or coordination of a device's subsystem (such as a graphics or sound processor), particular operations (such as a math coprocessor), and so forth. During operation, processors generate heat as a result of their operation. The processor may be attached to a carrier such as a circuit board.

Generally speaking, excessive temperature may disrupt a processor's operation or, in more severe cases, damage the processor. Further, effective cooling of a processor may allow the processor to operate at higher performance levels. Accordingly, a heat sink may be affixed to the processor in order to dissipate thermal energy generated by the processor. Similarly, heat sinks may be attached to other computing elements that generate heat in order to transfer heat away therefrom and safely dissipate the heat. A heat sink is one example of a thermal conductor, which may then dissipate the heat to the air, a liquid, or other similar cooling sub-system.

The interface between the processor and heat sink may be referred to as a "thermal joint." The rate of conductive heat transfer, Q, across the interface may be further refined to include the effects of contact resistance which then can be approximated by $$Q = \frac{KA(Tc - Ts)}{L}$$

where K is the thermal conductivity of an interface material (whether a dedicated thermal interface material discussed below, air, or another material), A is the heat transfer area, L is the interface thickness and Tc and Ts are the chip surface and heat sink temperatures. The thermal resistance of a thermal joint, Rcs, is given by $$Rcs = \frac{(Tc - Ts)}{Q}$$

and on rearrangement, $$Rcs = \frac{L}{KA}$$

Thus, the thermal resistance of the thermal joint is directly proportional to the thermal joint thickness and inversely proportional to the thermal conductivity of the medium making up the thermal joint and to the size of the heat transfer area.

Thermal resistance may be minimized by making the thermal joint as thin as possible, increasing thermal joint thermal conductivity by eliminating interstitial air and making certain that both surfaces are in intimate contact. The thermal resistance of the thermal contact arrangement (which, in one example, includes the thermal joint, processor or chip, and heat sink) may be generally expressed as the thermal resistance of the thermal joint plus the thermal interface resistances of the chip and heat sink:

$$Rtotal = \frac{L}{KA} + Rc\text{-}i + Rsi\text{-}c$$

where Rtotal is the total resistance of the thermal contact arrangement, Rc-i is the thermal resistance between the chip and interface material and Ri-s is the thermal resistance between the interface material and the heat sink.

A thermal interface material (TIM) may be sandwiched or placed between the processor and the heat sink. The TIM may facilitate or enhance heat transfer between the processor and heat sink, thus potentially reducing the temperature experienced by the processor and/or extending the processor life. The TIM essentially performs the functions of eliminating at least some interstitial air pockets and enhancing contact between the processor and heat sink. Further, a TIM typically has a higher thermal conductivity K than air, and thus enhances the rate of conductive heat transfer Q.

TIMs, however, may suffer from migration over time. Put simply, some TIMs tend to move away from the thermal joint with time, flowing or otherwise migrating out from the heat transfer surface area of the processor and/or heat sink. As the TIM migrates, air pockets may form in the thermal joint, and rate of conductive heat transfer between processor and heat sink may drop. Thus, as time passes, the aforementioned problems may occur even though a TIM is initially used.

BRIEF SUMMARY OF THE INVENTION

Generally, one exemplary embodiment of the present invention takes the form of an apparatus for conducting heat from a computer component, such as a central processing unit (CPU), graphics processor, other processor, memory element, or other computer element generating heat. It also should be noted the various embodiments described herein may be used with electronics or devices included in objects other than computers, such as handheld devices, telephones (mobile and otherwise), entertainment devices (including audio and video devices, such as stereo equipment and televisions), and so forth.

The exemplary embodiment may include a thermal interface material (TIM), such as a grease, paste, solid or liquid. The function of a thermal interface material is generally known to those skilled in the art described above in the Background of the Invention. Although certain TIMs may be described herein with respect to certain embodiments, it should be understood alternative embodiments may employ other TIMs as known to those skilled in the art.

The exemplary embodiment may further include a seal or gasket at least partially enclose the TIM. This seal may, for example, take the form of a ring having a C-shaped or U-shaped cross section where the arms of the "C" extend outwardly from a sidewall. That is, the arms of the "C" point away from the center of the ring-shaped gasket. (Alternative embodiments may reverse the direction of the arms.) The gasket may facilitate retaining the TIM within its sidewall, and thus in place on or near a computer component. Generally, the gasket may be placed between the computer component (or a silicon board or other material upon which the computer component is located, referred to herein as a "carrier") and a heat sink.

A first exemplary embodiment of the present invention takes the form of an apparatus for containing a computing element, including a containment element operative to define a containment area at least partially containing the computing element, a insert adjacent the containment element and operative to set a distance between the containment element and the computing element, and a desiccant contained within the containment element.

A second exemplary embodiment of the present invention takes the form of an apparatus for transferring heat from a computing element to a heat sink, including a gasket defining a containment area within the gasket, a vapor barrier at least partially spread across some of the gasket, an insert positioned within the containment area and adjacent the gasket, the insert defining an aperture, a desiccant positioned within the containment area; and a thermal interface material positioned within the containment area.

A third exemplary embodiment of the present invention takes the form of a barrier for use with a thermal interface material, including a gasket comprising a sidewall having a first end and a second end, a first leg extending from the first end of the sidewall, and a second leg extending from the second end of the sidewall, wherein the sidewall, first leg, and second leg are at least partially formed from a first metal, and the sidewall, first leg, and second leg form a C-shape.

A fourth exemplary embodiment of the present invention is a method for manufacturing an apparatus to transfer heat from a computing element to a heat sink, including the operations of forming a desiccant, adhering the desiccant to a carrier such that a chip affixed to the carrier seats within an aperture, placing a gasket around the desiccant, applying a thermal interface material to the chip, removing an oxidant from the thermal interface material, and placing a heat sink atop the thermal interface material and gasket.

A fifth exemplary embodiment of the present invention is a method for manufacturing an apparatus for containing a thermal interface material, including the operations of resetting a desiccant, placing an adhesive on at least one of an insert and a carrier, adhering the insert to the carrier, positioning a chip within an aperture formed in the insert, placing a gasket about the insert, applying a thermal interface material to a surface of the chip, removing an oxidant from the thermal interface material, and seating a heat sink above the thermal interface material.

DETAILED DESCRIPTION OF THE INVENTION

Figure 1:
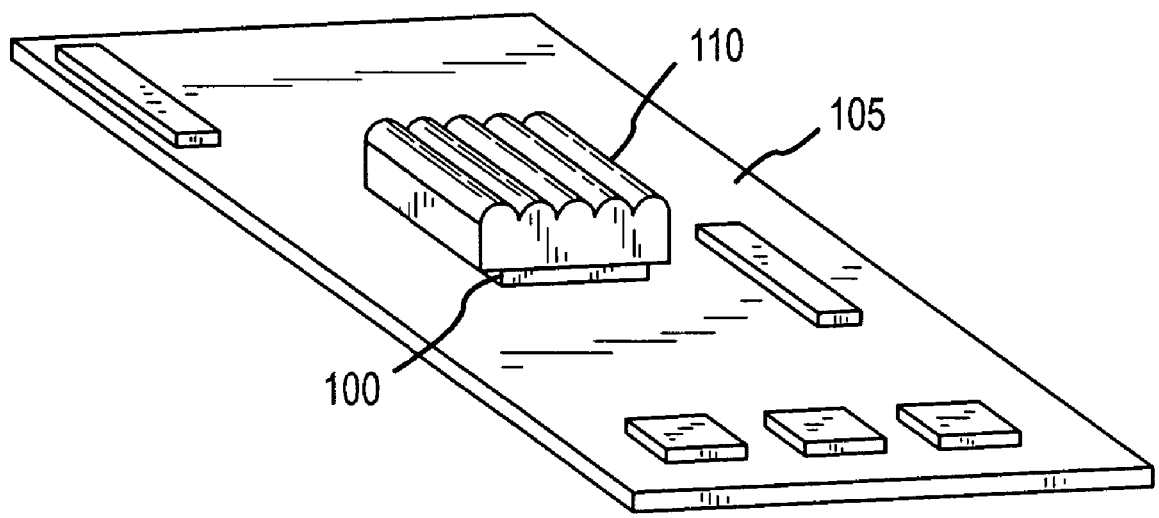
FIG. 1 depicts a heat sink, processor, and carrier in an operating configuration.

Generally, one exemplary embodiment of the present invention takes the form of an apparatus for conducting heat from a computer component, such as a central processing unit (CPU), graphics processor, other processor, memory element, or other computer element generating heat. It also should be noted the various embodiments described herein may be used with electronics included in objects other than computers, such as handheld devices, telephones (mobile and otherwise), entertainment devices (including audio and video devices, such as stereo equipment and televisions), and so forth.

The exemplary embodiment may include a thermal interface material (TIM), such as a grease, paste, solid or liquid. The function of a thermal interface material is generally known to those skilled in the art described above in the Background of the Invention. Although certain TIMs may be described herein with respect to certain embodiments, it should be understood alternative embodiments may employ other TIMs as known to those skilled in the art.

The exemplary embodiment may further include a seal or gasket at least partially encircling the TIM. This seal may, for example, take the form of a ring having a C-shaped or U-shaped cross section, where the first and second arms of the "C" extend outwardly from a sidewall. That is, the arms of the "C" point away from the center of the ring-shaped gasket. (Alternative embodiments may reverse the direction of the arms.) The arms of the gasket, whether C-shaped or U-shaped, may be substantially parallel for the entirety of their lengths or may extend at mirrored angles from the sidewall for at least part of their lengths. Further, the arms of the gasket may extend at such mirrored angles for a portion of their lengths, then run parallel to one another. The gasket may facilitate retaining the TIM within its sidewall, and thus in place on or near a computer component. Generally, the gasket may be placed between the computer component (or a silicon board or other material upon which the computer component is located, referred to herein as a "carrier") and a heat sink. It should be noted that alternative embodiments of the gasket may have an S-shape, V-shape, U-shape, W-shape, or a first arm extending in a first direction from the sidewall and a second arm extending in an opposing direction from the sidewall. Such an "opposing arm" gasket may look, for example, like a stair step in vertical cross-section. Alternatively, the gasket may be O-shaped in cross-section, like an O-ring. The gasket may be solid or hollow in cross-section.

Additionally, the gasket may be at least somewhat flexible to permit it to deform while under pressure from the heat sink and/or carrier. By deforming, a larger length of sidewall may be brought into contact with either the heat sink or carrier, thus forming a larger barrier to vapor, water or moisture migrating from outside the gasket to inside the gasket.

As may be appreciated, the gasket may at least partially define a containment area within its sidewall or sidewalls. The containment area may be further bounded by the computer component/chip or carrier and heat sink. In this manner, the containment area may be bounded on all sides in certain embodiments. "Containment," as discussed herein, broadly refers to keeping the TIM inside the containment area and away from components and/or surfaces with which the TIM may be incompatible. "Containment" may additionally or alternatively refer to isolating the TIM from incompatible materials external to the embodiment, such as gasses, vapors, moisture, and so forth. Generally, the TIM is placed within this containment area.

A vapor barrier may be spread across some or all of the gasket. The vapor barrier may reduce the migration of water or another compound, in either a liquid or gaseous form, into the containment area from the atmosphere. It should be appreciated that the vapor barrier (and/or gasket) may permit some vapor or moisture to enter the containment area, insofar as the vapor barrier and/or gasket may be vapor-resistant, but not necessarily vapor-impermeable. The vapor barrier may be gas-impermeable and/or moisture-impermeable. For example, the vapor barrier may inhibit or prevent the migration of gasses such as oxygen, nitrogen and carbon dioxide from outside the gasket (and thus the embodiment) into the containment area.

A desiccant may also be included in the exemplary embodiment. Typically, the desiccant is also placed within the gasket's containment area and adjacent or near the TIM. The desiccant may act to absorb at least some vapor that enters the containment area. In this manner, the desiccant may prevent vapor from contacting the TIM, computer component and/or carrier and eventually corroding these items. The desiccant may be compartmentalized or otherwise contained within a specific area of the containment area, or may alternatively be intermingled with the TIM.

Various embodiments of the invention, along with their methods of use and/or manufacture, are described in more detail herein.

FIG. 1 depicts an exemplary processor 100 (or other chip) mounted on an exemplary carrier 105, such as a graphics card, sound board, motherboard, or other computer, network, or telephony hardware, board, card, or intermediary such as the chip package. The "chip package," as used herein, is generally interchangeable with the term "carrier."

The exact function of the processor 100 and/or board 105 may vary. For example, the processor may be a dedicated graphics processor, a central processing unit, a memory processor, and so forth. Accordingly, it should be understood that various embodiments of the present invention may be used in any number of exemplary environments, networks, telephony systems or computer systems, and implemented on a wide variety of computer, network or telephony hardware (for example, the aforementioned boards or cards) and with any of a number of different types of processors. As yet another example, a smart card having an internal processor may employ an embodiment of the present invention, as may any other portable processing device. It should be understood that exemplary operating environments in which exemplary embodiments of the present invention may operate or be found include personal computers, network servers, microcomputers, minicomputers, desktop computers, notebook computers, mobile telephones, personal computing or scheduling devices, personal communication devices, switches, routers, tablet computing devices, digital entertainment devices such as MPEG Layer-3 (MP3) players or cameras, and so forth. Essentially, embodiments of the present invention may be used in any electronic environment having a need to efficiently transfer heat from one surface to another.

Returning to FIG. 1, a processor 100 is affixed to a carrier 105. The processor 100 may be attached to the carrier 105 by one or more prongs or a socket extending through one or more vias and into the material of the carrier, solder, an adhesive, or by any other means known in the art. The carrier may be, for example, a printed circuit board (PCB) or other type of circuit board, integrated circuit or system-on-chip design, breadboard, stripboard, or other electrical component or appropriate material as known to those of ordinary skill in the art. A heat sink 110 generally is attached to the chip 100 and, optionally, to the carrier 105, as known in the art.

Figure 2:
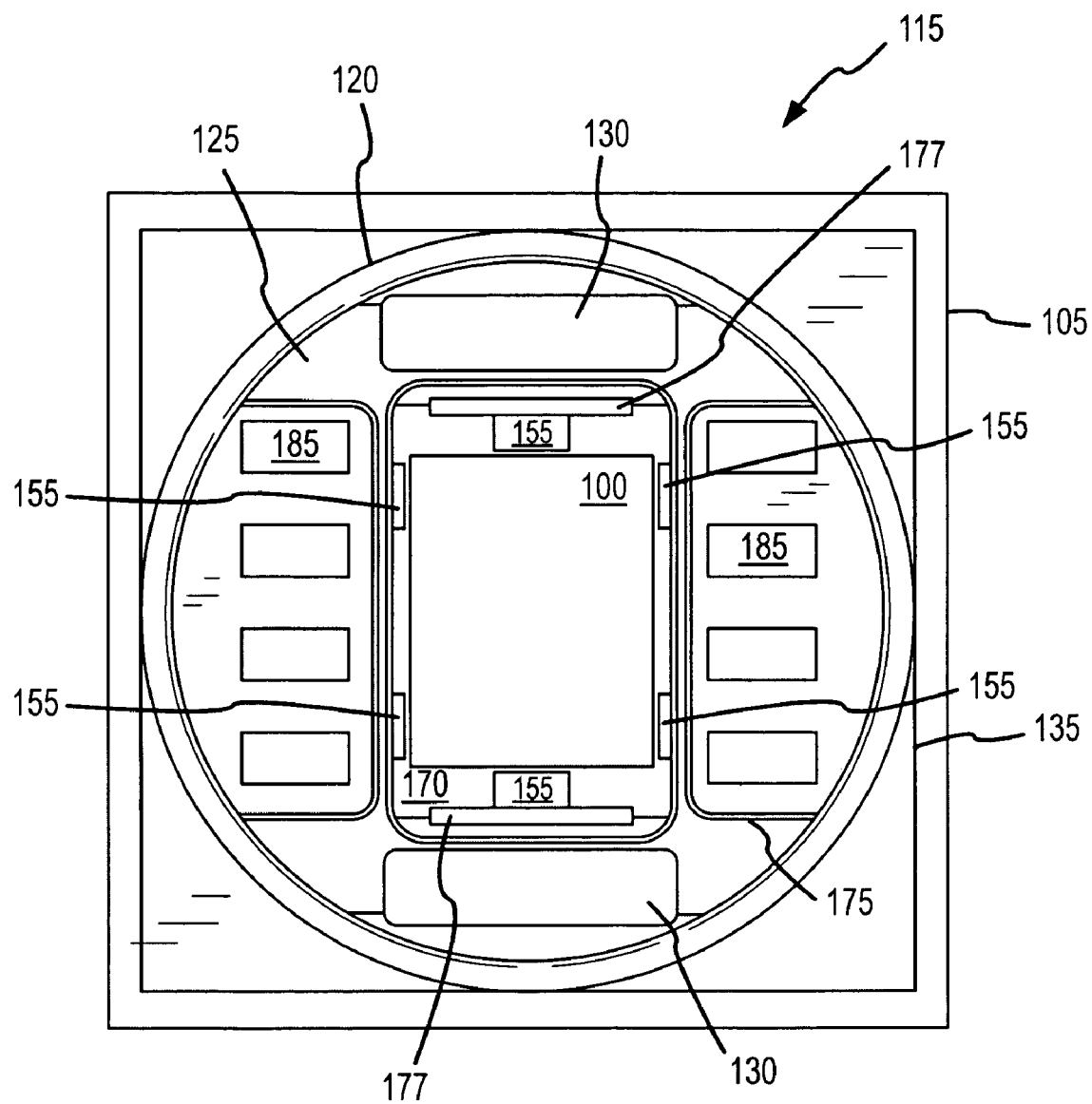
FIG. 2 depicts the embodiment fitted to a carrier.

FIG. 2 generally depicts a first exemplary embodiment of the invention. The embodiment 115 may be fitted to a carrier 105, as shown in FIG. 2. The embodiment 115 and carrier 105 may be then placed at least partially adjacent the heat sink 110. In the view of FIG. 1, the heat sink 110 obscures the embodiment 115. Accordingly, FIG. 2 depicts a top-down view with respect to FIG. 1, with the heat sink removed.

Figure 3:
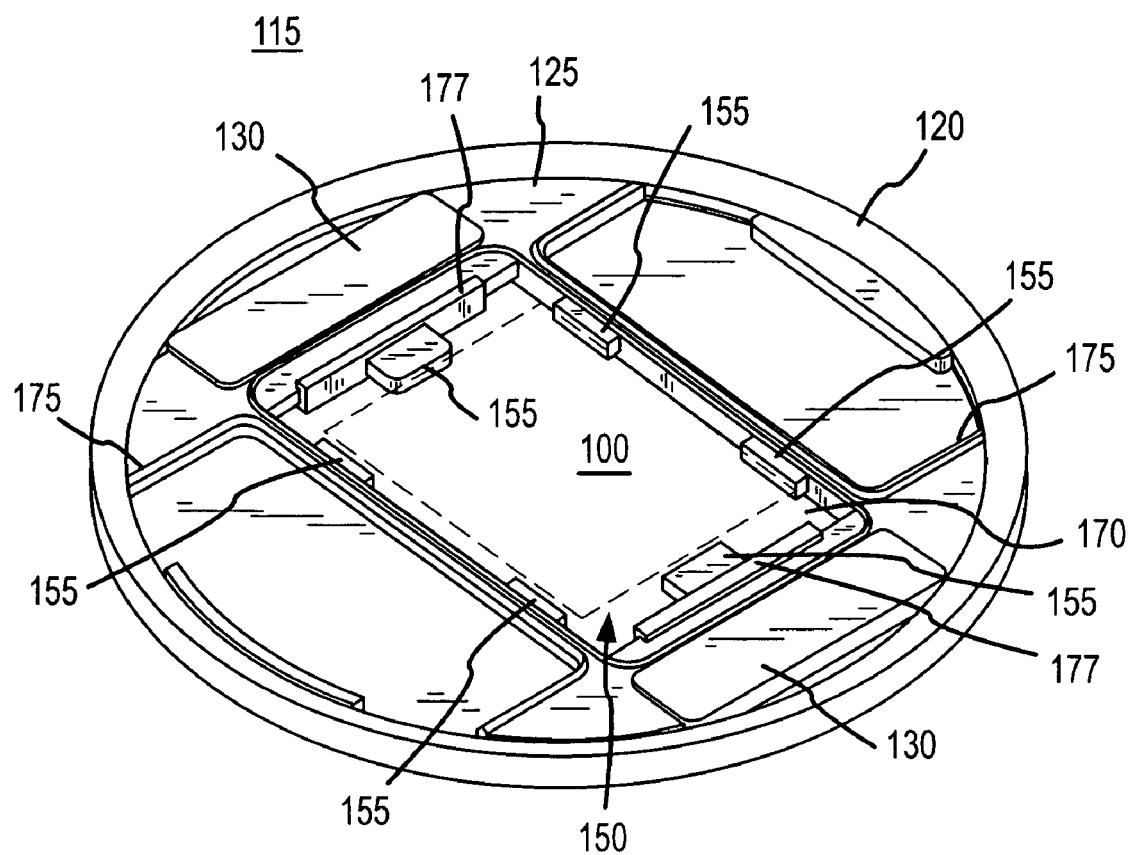
FIG. 3 is a perspective view of the exemplary embodiment removed from the heat sink.
Figure 4:
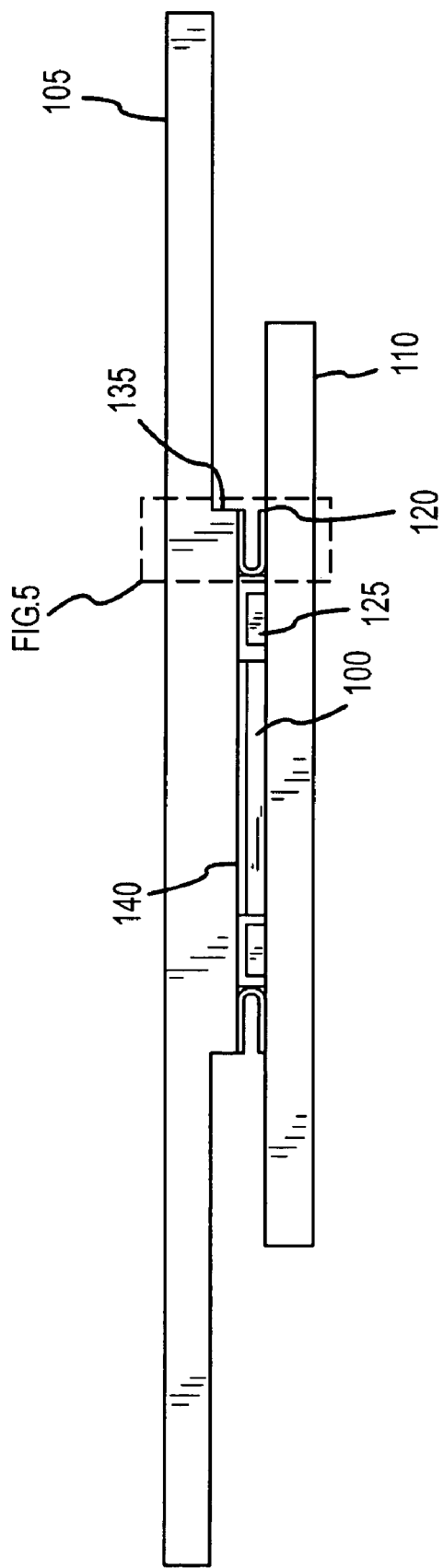
FIG. 4 is a simplified cross-sectional view of the heat sink and embodiment mounted to the computer chip and carrier.

FIG. 3 is a perspective view depicting the exemplary embodiment 115 removed from the carrier 105 and/or heat sink 110. FIG. 4 is a simplified cross-sectional view of the heat sink 110 and embodiment 115 mounted to the computer chip 100 and carrier 105. It should be understood that the cross-sectional view of FIG. 4 is simplified and not intended to exactly depict the relationship or positioning between the heat sink 110, chip 100, carrier 105 and elements of the exemplary embodiment 115.

With respect to both FIGS. 2 and 3, the embodiment 115 may include a gasket 120 forming an outer barrier. Contained within the gasket 120 may be an insert 125, TIM 140, and one or more desiccant 130. The base of the gasket 120 may seat against a plinth 135 formed on the heat sink 110 or carrier 105. Generally, although not necessarily, the outer perimeter of the gasket is contained within the outer perimeter of the plinth. (FIG. 6, for example, depicts an alternative embodiment where the gasket 120 is seated around the plinth 135, rather than atop it.)

Figure 5:
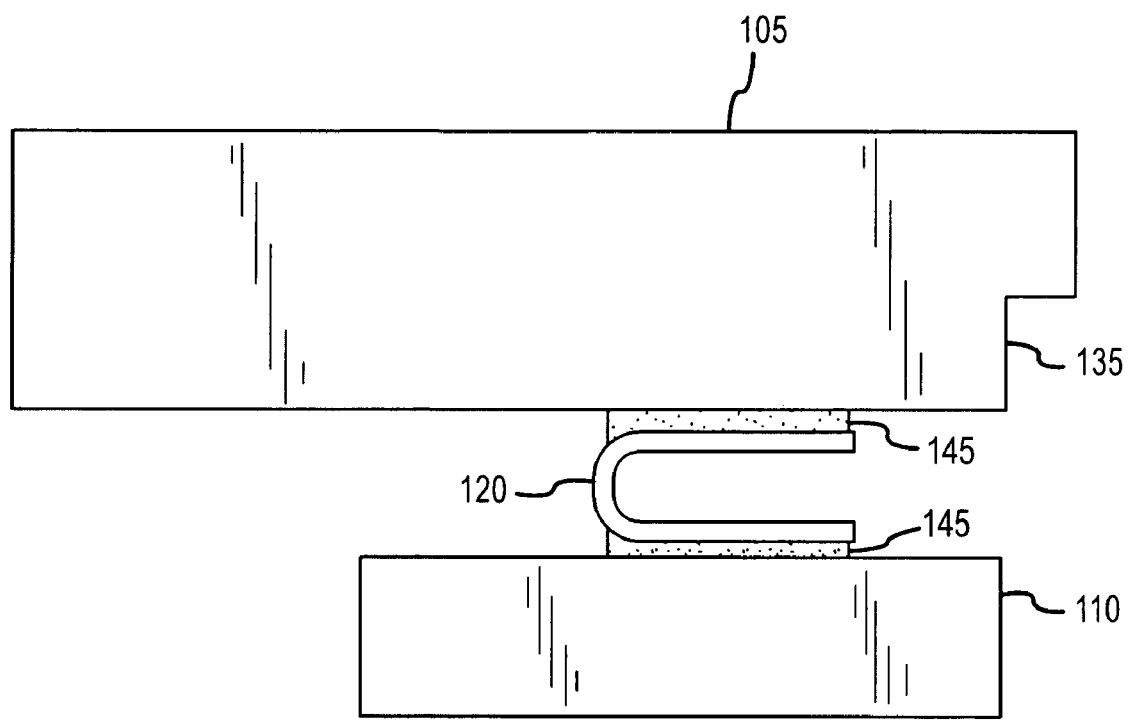
FIG. 5 is an exploded cross-sectional view of a portion of FIG. 4.

The gasket 120 generally serves to contain the TIM 140, insert 125, and desiccant 130 within the containment area defined by the gasket. The gasket 120 may be made of a variety of materials, such as a metal (such as nickel, gold, brass, molybdenum or steel), a plastic (such as polychlorotrifluoroethylene), or a composite. For example, the gasket 120 may be a plastic, rubber or metal covered or electroplated with a metal, such as nickel, gold, brass, molybdenum or steel. As yet another example, the gasket may be made through an electroforming process, yielding a metal gasket having extremely precise tolerances and measurement. In yet other embodiments, a Buna or silicone rubber may be used to form the gasket. It should be noted that embodiments made of a rubber, plastic, or other material may be formed in shapes other than the aforementioned C-shape. Generally, the gasket 120 may be made of a material that is weakly reactive or essentially nonreactive with the TIM 140 and/or atmosphere. The gasket 120 may likewise be weakly or essentially nonreactive with liquids or vapors, such as water. As shown in FIG. 5, which is an exploded cross-sectional view of a portion of FIG. 4, a vapor barrier 145 may at least partially coat or be affixed to the gasket 120. The vapor barrier 145 may diminish the rate at which water vapor or liquid enters the containment area by filling in small cracks and surface imperfections between the gasket and the seat with an impermeable (and possibly lubricating) material. One exemplary vapor barrier 145 is the grease known commercially as KRYTOX, and manufactured by E. I. duPont de Nemours and Company. Alternatively, the vapor barrier 145 may be a relatively soft metal, such as indium or copper, coating or otherwise at least partially encircling the gasket. The vapor barrier 145 generally has a low moisture permeability. Further, the vapor barrier may be supplemented with other moisture-impermeable materials to inhibit moisture from entering the gasket interior. Exemplary moisture-impermeable materials that may be used for this purpose include gold, titanium, chromium, nickel, platinum, and so forth. A thin layer of soft metal, such as gold, copper, indium or aluminum, may cover the outer surface of the gasket in this manner and serve as the vapor barrier. Under pressure, such a soft metal may deform and at least partially fill surface imperfections and/or irregularities between the gasket and the seat.

Returning to FIG. 3, an insert 125 is generally placed within the containment area and encircled by the gasket 120. The insert 125 may be made of any suitable material, such as a rubber, plastic or metal. The insert typically has an aperture 150 formed approximately in its middle. One or more locating features 155 may extend from the insert 125 into the aperture 150. The aperture, in combination with the optional locating feature(s), is sized to accept a computer chip 100 and quantity of TIM 140. It should be noted that the insert 125 shown in FIG. 3 may be segmented into two or more sections. For example, the depicted insert 125 may be replaced with a smaller insert and an insulator. Such an insulator effectively serves to occupy space within the gasket when a full-size insert is not used, as well as position the insert with respect to the gasket 120.

The aforementioned combination of aperture 150 and locating feature(s) 155 may be sized to accept the computer chip 100 relatively snugly within the aperture. The locating feature(s) 155, for example, may locate the embodiment 115 relative to the computer chip 100 to minimize or reduce motion of the embodiment 115 with respect to the chip. Effectively, the locating feature(s) 155 (or the edge of the aperture 150) may serve to locate relative to the chip 100.

As may be appreciated from FIG. 3, the locating feature(s) 155 may define a receptacle area 160 (shown in dashed lines) for the chip 100 that is smaller than the area of the aperture. Thus, when the computer chip 100 is seated within the receptacle area 160, the entirety of the aperture is generally not filled by the chip. The additional area of the aperture may be referred to as an "overflow area" 170. The overflow area 170 may accept any TIM 140 that migrates off the chip, preventing the TIM from flowing to an undesirable area of the heat sink 110 or carrier 105. It should be appreciated that the overflow area 170 may be omitted in certain embodiments of the invention.

The insert 125 or desiccant 130 may include one or more ribs 175 formed on its surface. The rib or ribs 175 generally (although not necessarily) extend perpendicularly from the main plane of the insert 125. The ribs may stiffen the insert, enhancing the insert's ability to resist a compressive force, such as that exerted by the gasket 120. Accordingly, the rib or ribs 175 may assist in maintaining both the shape of the insert 125 and the abutment of insert and gasket. Additionally, these ribs may form a partial or complete barrier to direct and contain TIM overflow to TIM overflow areas.

Further, one or more surface-mounted electronic component chambers 185 may be defined in the insert 125 (see FIG. 2). The chambers 185 are generally sized and shaped to accept one or more surface-mounted electronic components attached to the chip package 105. When the embodiment 115 is installed with the chip 100 resting in the aperture, the component or components fit within the chamber(s) 185. The chambers may extend entirely through the insert 125 or only partially therethrough.

As previously mentioned and shown in FIGS. 2 and 3, the embodiment 115 may also include a desiccant 130. The desiccant 130 may be a powder or may be pressed, molded or bonded into a solid form. For example, the desiccant 130 may be mixed with a polymer and the polymer cast into a solid form. Such a desiccant/polymer mix generally does not substantially inhibit the desiccant's ability to absorb vapor, and may be more amenable to shaping into a solid of a desired form than the desiccant alone. Alternative embodiments may mix the desiccant 130 with silicon and mold the mixture into a particular solid shape. This desiccant may also combine with or fully constitute at least a portion of the insert 125. Additionally, the desiccant may insulate sensitive electrical elements from moisture (by absorbing such moisture) or the TIM (by overlying the electrical element and forming a physical barrier to the TIM). Likewise, the desiccant 130 may seal certain portions of the chip package from exposure to liquid.

As shown in FIG. 3, one exemplary embodiment 115 generally has two desiccants 130 spaced apart. Each desiccant 130 may absorb any moisture, vapor or other form of corrosive vapor (such as sulfur) that migrates through the gasket 120, vapor barrier 145, and/or insert 125. Additionally, the desiccant or insert may be positioned over certain portions of a computing element, chip 100 or carrier 105 in order to prevent migrating TIM 140 from contacting such items. Certain elements (such as portions of the heat sink 110, carrier 105, chip 100, or associated electrical components) may corrode or cease to function if the thermal interface material 140 contacts the element for a period of time. Accordingly, by placing the desiccant 130 or insert 125 above such an element, TIM that moves from atop the chip may be prevented from contacting sensitive elements or areas of the carrier.

Figure 7:
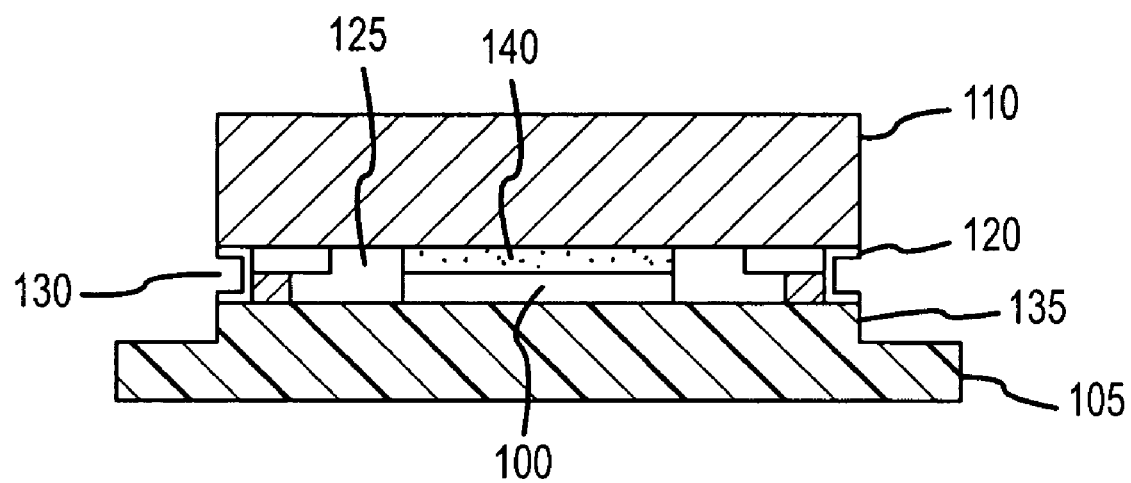
FIG. 7 is a cross-sectional diagrammatic view of the embodiment placed adjacent to a heat sink and carrier.

The thermal interface material 140 employed by the embodiment 115 may be generally seen in FIG. 7, which is a cross-sectional diagrammatic view of the embodiment placed adjacent a heat sink 110 and carrier 105. The TIM 140 employed by at least this exemplary embodiment of the present invention is a "liquid metal TIM," meaning that the TIM compound contains at least some metal and is liquid at an operating temperature. The metal may be in the form of metallic particles. Typically, although not necessarily, the TIM 140 is a eutectic mixture. In certain embodiments, the TIM may be, for example, a paste or liquid containing a gallium-indium-tin mixture or a mixture containing titanium and diamond particles. The TIM may further or alternatively include a metal alloy, or may be a heterogeneous mixture. Alternative embodiment may employ a TIM 140 including bismuth, lead, zinc, silver, palladium, and so forth in alloy form or as particulates. A low melt solder or semi-liquid may serve as a TIM or a carrier for a TIM. The TIM may include organic or inorganic compounds. Essentially, although the present exemplary embodiment employs a TIM 140 having a gallium-indium-tin mixture, alternative embodiments may employ any TIM in any form known to those skilled in the art.

Additionally, the TIM 140 may be impregnated with solid non-metallic particles. Such non-metallic particles may enhance interfacial adhesion to either or both the chip and heat sink without appreciably increasing thermal resistance of the TIM. The particles may also enhance viscosity of the TIM 140.

The TIM 140 is generally applied between the chip 100 seated in the embodiment's aperture and the heat sink 110. The gasket 120 surrounds the TIM and chip and acts (in combination with the vapor barrier 145) as an isolation barrier to isolate the TIM from atmosphere outside the gasket. As discussed above, the TIM 140 itself generally conducts heat from the chip 100 (or other computing element) to the heat sink 110.

The TIM 140 generally bonds or adheres to both the silicon of the chip 100 and to the heat sink 110. One or both of the chip and heat sink may be treated to increase a surface affinity with the TIM. Broadly speaking, the surface affinity and surface tension between the TIM 140 and the chip 100, and the TIM and the heat sink 110, keep the TIM in place and may mitigate or reduce migration off the chip. With time, however, it should be noted that the TIM may migrate due to pressure exerted by either the chip or heat sink or due to a lowering of surface tension or affinity. The migrating material is typically caught in one or more overflow areas 175 as discussed above.

Figure 8:
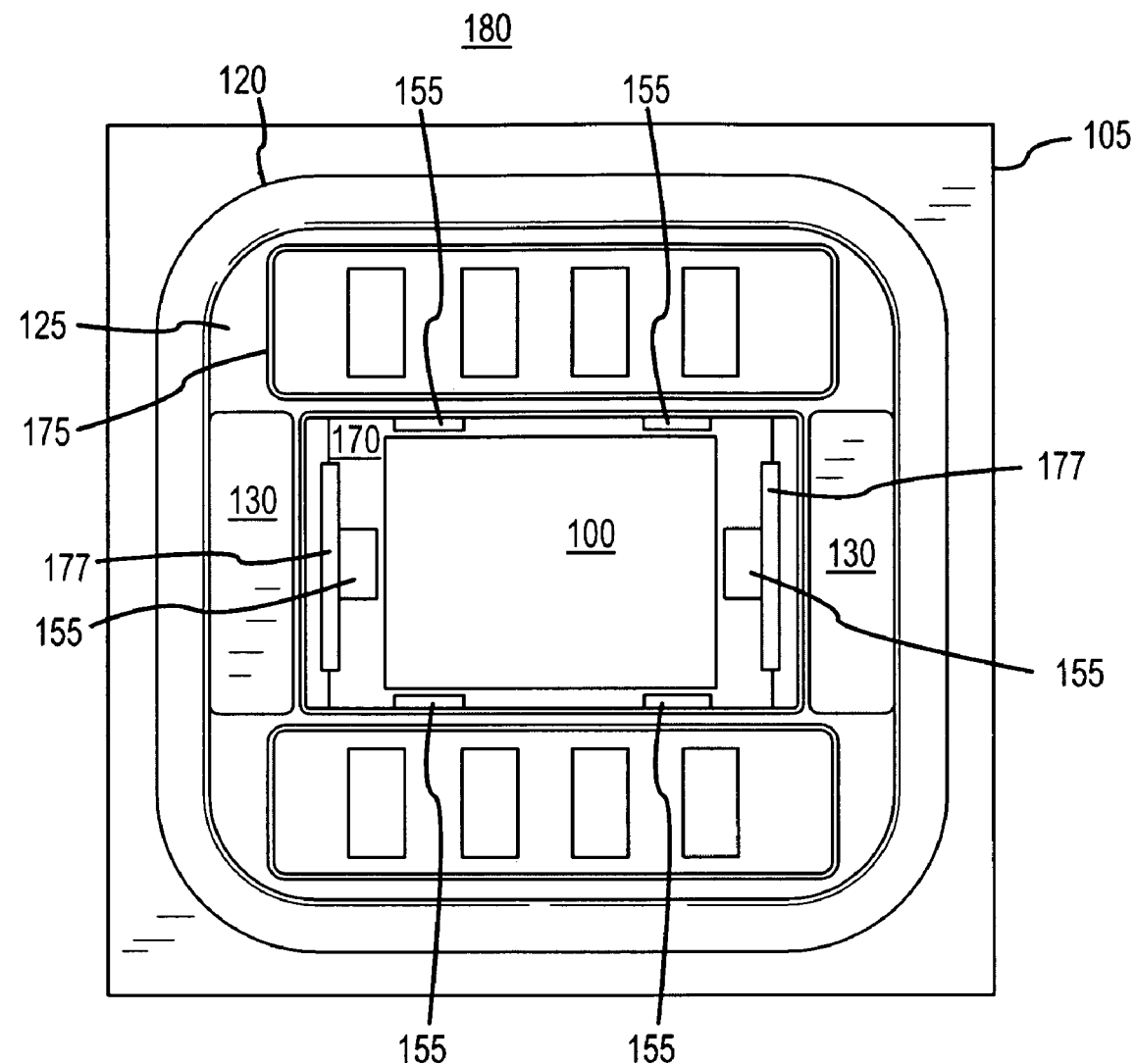
FIG. 8 depicts yet another embodiment of the present invention employing a square gasket.
Figure 9:
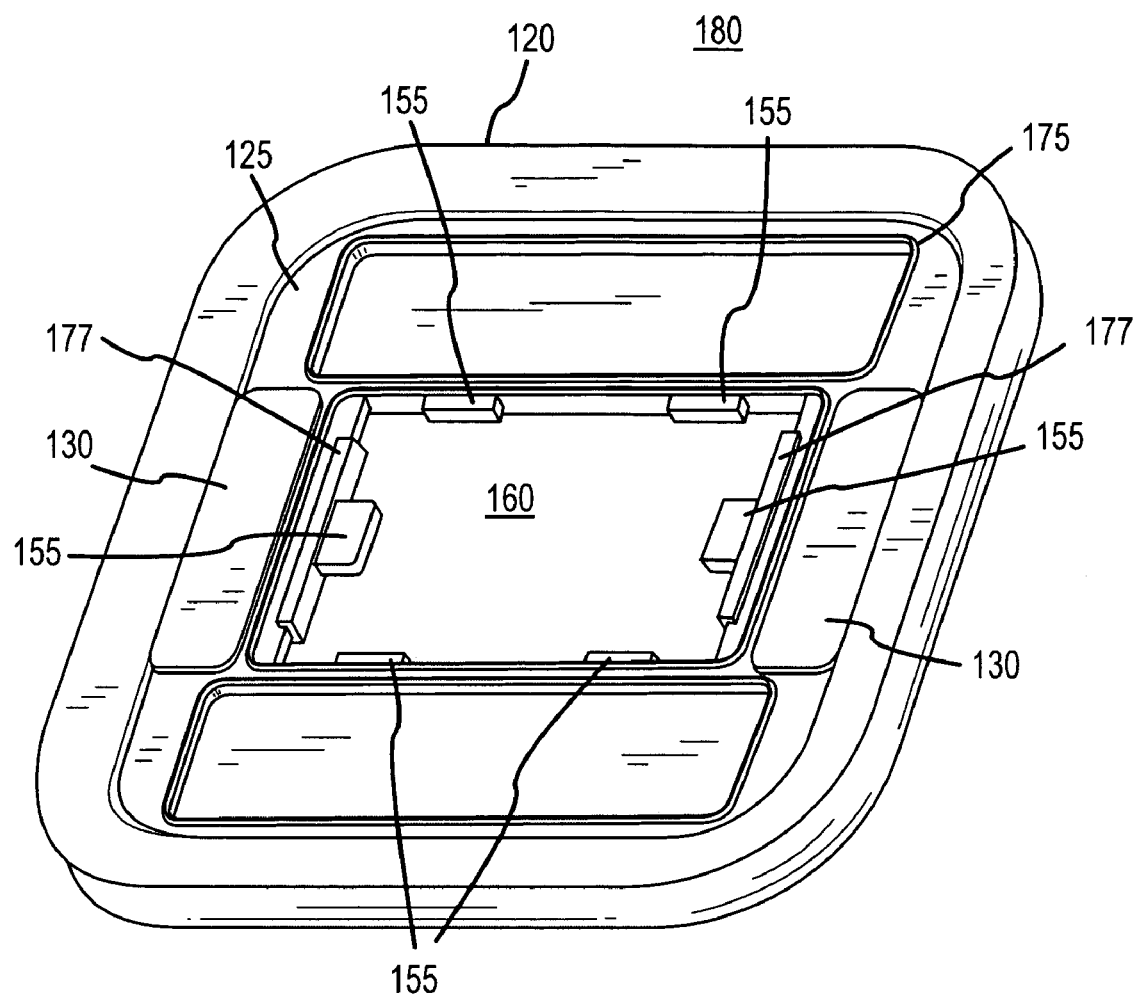
FIG. 9 is a perspective view of the embodiment shown in FIG. 8.

Another embodiment 180 of the invention may be generally square in shape, as shown in FIG. 8. Such an embodiment 180 may include a square gasket 120 and insert 125, as well as the aforementioned desiccant 130 and vapor barrier 145. As also shown in FIG. 8, the gasket 120 and insert 125 may have rounded corners (although alternative embodiments may employ squared-off corners). The rounded corners generally distribute stresses and pressures more evenly throughout the corners, thus minimizing or reducing warping or deformation with time. Generally, the gasket 120, insert 125, aperture, desiccant 130, and vapor barrier 145 all act as described above with respect to the embodiment 115 of FIG. 3. It should be noted, however, that the square embodiment 180 may have full crush ribs 175 that do not intersect the outer edge of the insert 125. FIG. 9 is a perspective view of the embodiment of FIG. 8.

Figure 6:
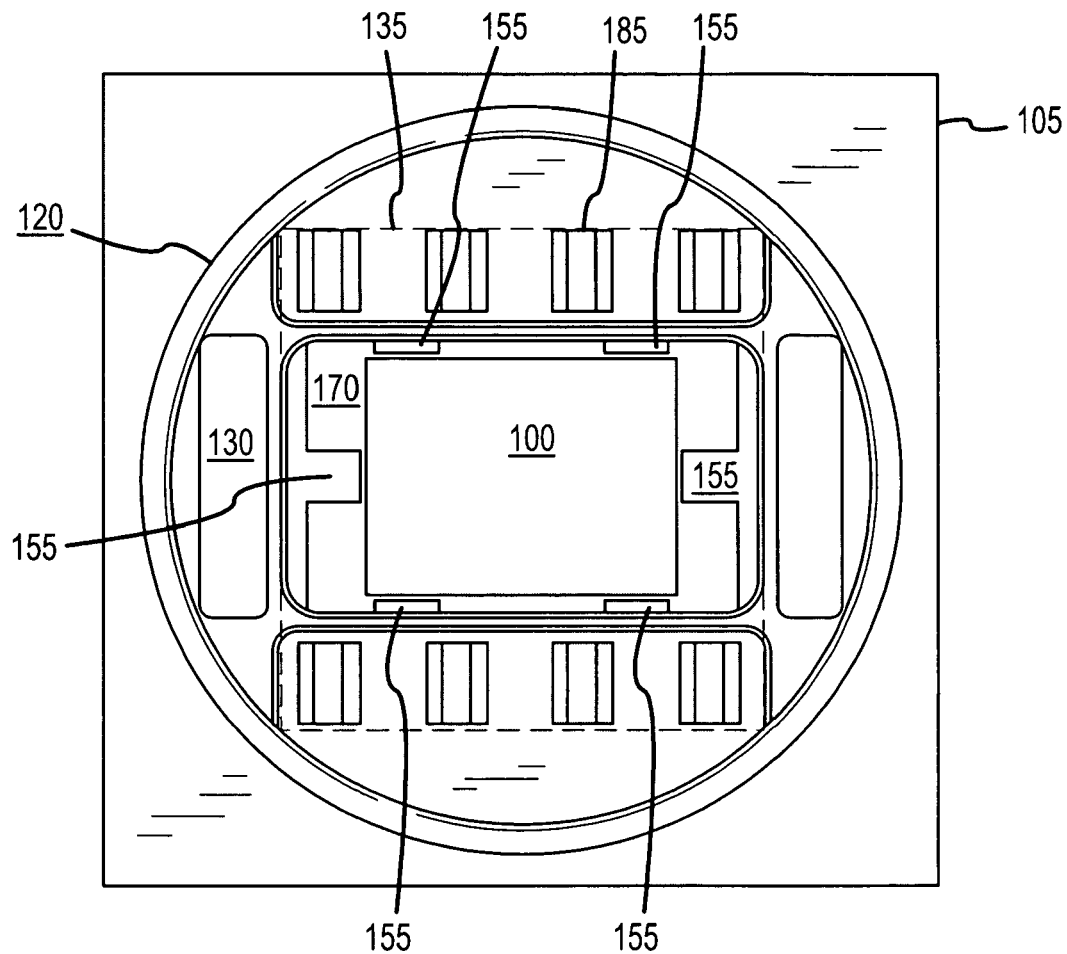
FIG. 6. depicts an alternative embodiment where the gasket is seated around a plinth.
Figure 10:
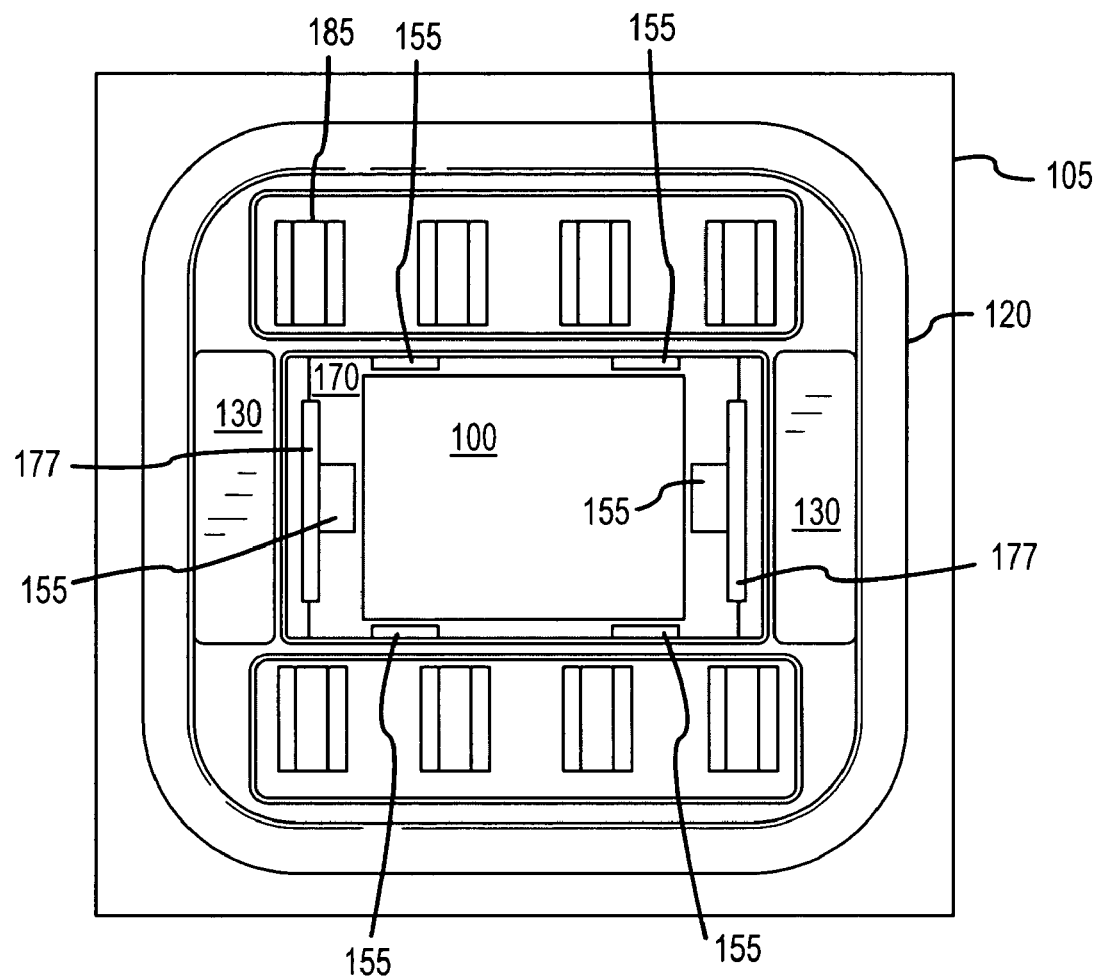
FIG. 10 depicts an embodiment of the present invention having a square shape and seated around a plinth.

FIGS. 6 and 10 depict, respectively, round and square embodiments 190, 195 of the present invention similar to those shown in FIGS. 3 and 8. Here, however, the gaskets 120 of the respective embodiments 190, 195 extend around the carrier's plinth 135, rather than resting on the plinth. Accordingly, the gasket may extend up to the edge of the chip package 105 (as in FIG. 6), or simply come close to the carrier's edge (as in FIG. 10). Otherwise, the embodiments of FIGS. 6 and 10 generally operate in a manner similar to that described with respect to FIGS. 3 and 8.

Alternative embodiments may be triangular, polygonal, elliptical, or asymmetrical in shape. Generally, the shape of the gasket will conform to the shape of the embodiment.

The various embodiments discussed herein may be used with either an air-cooled, liquid-cooled, or refrigerant cooled heat sink 110.

In order to maintain a common clearance between the base of the heat sink 110 and top of the chip 100 seated in the aperture, the thickness of the gasket 120 may vary between embodiments seated on or around the plinth. For example, in embodiments where the gasket 100 and insert 125 seat on the plinth 135, the gasket may be a first height (a "normal" gasket) to offset the heat sink 110 from the chip 100, carrier 105, and/or rest of the embodiment. In one exemplary embodiment, this normal cross-sectional height is approximately 1.15-1.20 millimeters when not under force.

Figure 11:
FIG. 11 depicts cross-sections of both a normal gasket and a tall gasket.

By contrast, in embodiments where the gasket 120 and insert 125 seat on the plinth 135, the gasket may be taller in cross-section to account for the additional height of the plinth. Typically, the gasket's cross-sectional height is 1.15-1.20 millimeters, plus the height of the plinth. This may be referred to as a "tall" gasket 120. FIG. 11 depicts simplified cross-sections of both a normal gasket and a tall gasket. Gaskets, whether tall or normal, have sidewalls that are approximately 60-70 micrometers thick in one embodiment.

Figure 12:
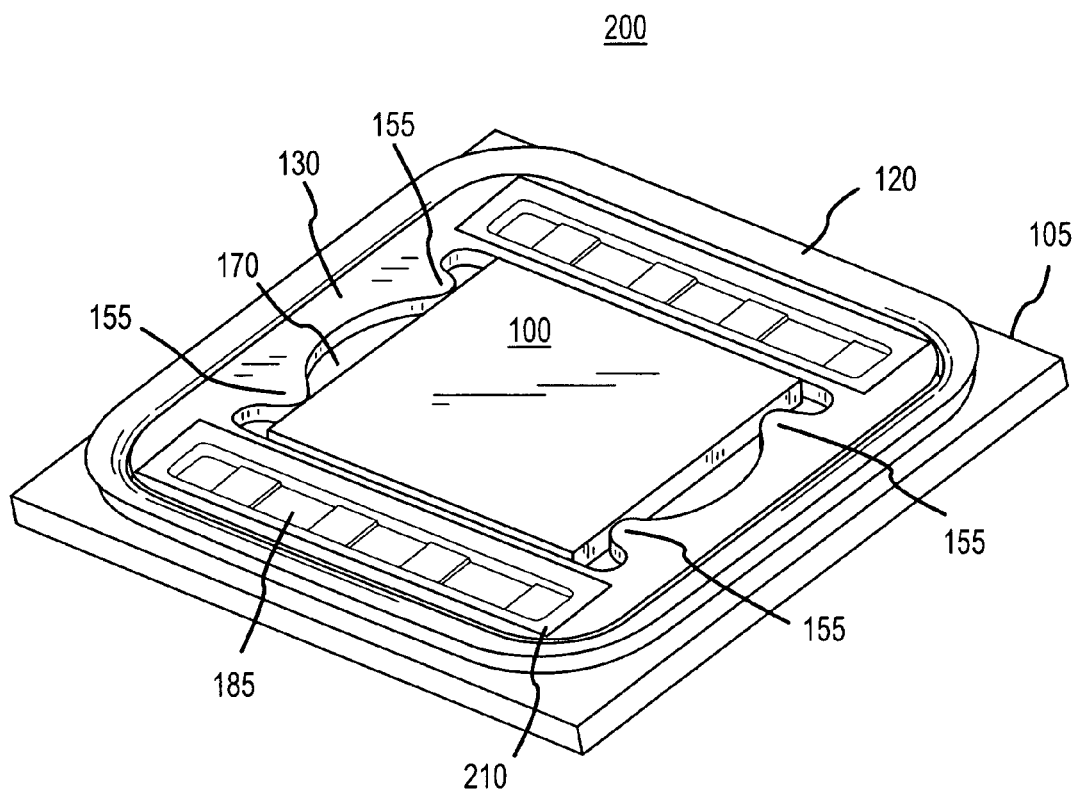
FIG. 12 depicts yet another exemplary embodiment of the present invention.
Figure 13:
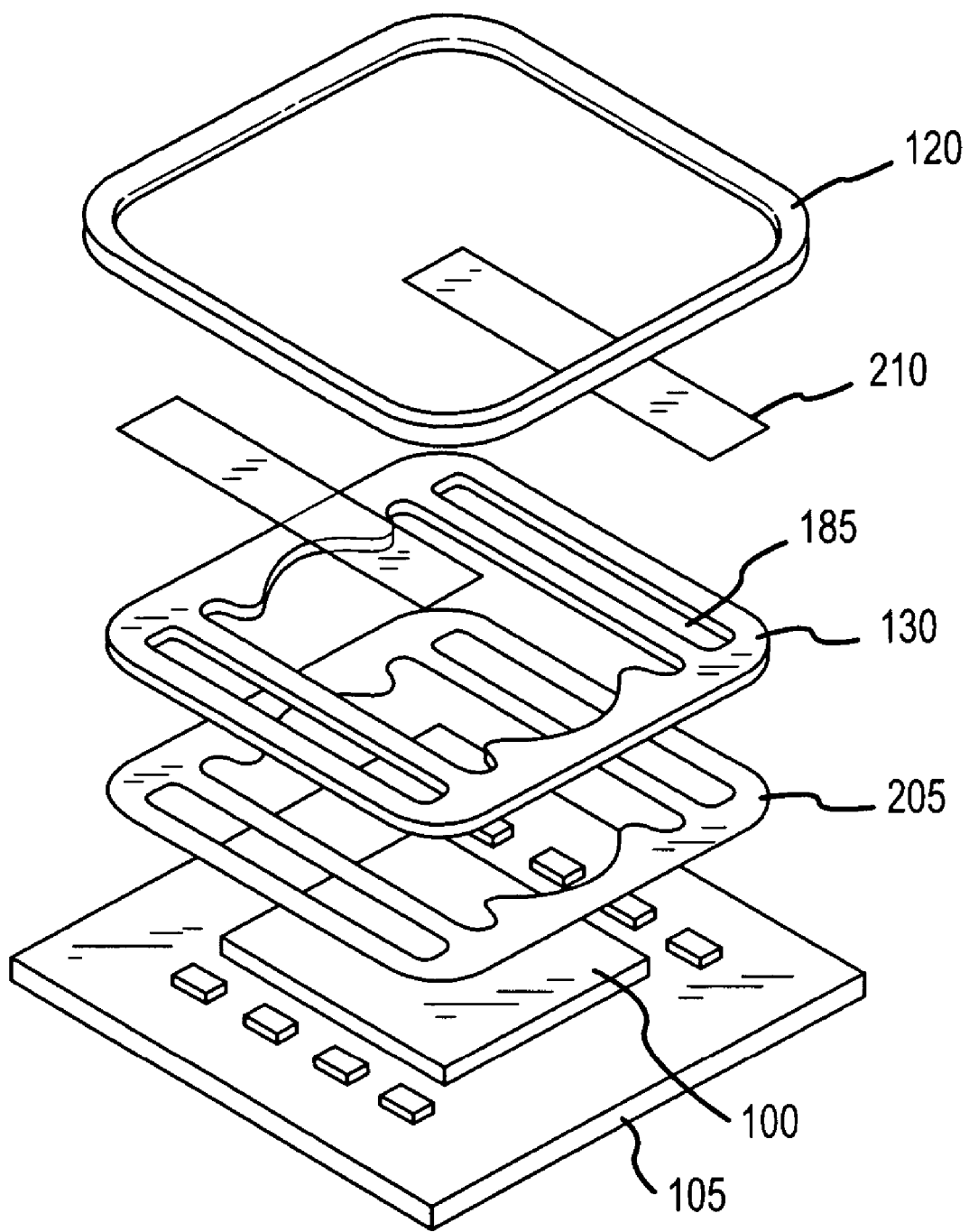
FIG. 13 is an exploded view of the embodiment of FIG. 12.

FIG. 12 depicts yet another exemplary embodiment 200 of the present invention. This embodiment 200 appears superficially similar to the one depicted in FIGS. 8 and 10, but differs in certain respects. FIG. 13 is an exploded view of the embodiment of FIG. 12, showing the various components of the embodiment.

As shown to best effect in FIG. 13, the present embodiment 200 may include many of same materials as previously-discussed embodiments, but in different configurations. For example, the chip 100 may still be affixed to a carrier 105, upon which one or more capacitors 185 may also rest. In the present embodiment 200, however, a layer of double-stick tape 205 or other adhesive may be placed between the carrier 105 and molded desiccant 130 in order to permit the desiccant to adhere to the carrier. The desiccant 130 itself may be molded to take the place of the insert 125. The molded desiccant may be sufficiently rigid that no additional insert is required. Accordingly, the gasket 120 may be placed about the desiccant and the insert omitted. In such an embodiment, the desiccant is typically molded to include the chip-locating features 155 and aperture discussed above. Further, the desiccant 130 may define one or more chambers in which the surface-mounted electronic components may be received. A length of Kapton tape or similar electrically insulating material 210 may cover each such component chamber and complete the isolation of the component from the TIM.

In this embodiment 200, or in any other embodiment discussed herein, the desiccant 130 may be composed of approximately 50% silicone and 50% desiccating material such as a suitable powdered molecular sieve. The exact ratio of silicone to desiccating material may vary from embodiment to embodiment. For example, an embodiment may employ a desiccant having 60% silicone and 40% molecular sieve, 70% silicone and 30% molecular sieve, and so forth. Typically, the silicone comprises between 30% and 70% of the desiccant, as does the desiccating material. At least one exemplary embodiment may employ a type 4A molecular sieve, although it should be understood this particular molecular sieve is exemplary rather than limiting. The desiccant and/or insert may additionally contain additives such as volatile corrosion inhibitors to retard the effects of any corrosive materials either incompletely or ineffectively absorbed by the desiccant. Further, the desiccant may selectively absorb and desorb water vapor or moisture.

The molded desiccant 130 may be configured to include crush ribs 175 and/or features for locating the chip 100, as described above.

The present embodiment 200 may be constructed by first forming the desiccant 130 from the polymer (or other bonding/stabilizing material) and the sieve or other desiccant material. The desiccant 130 may be cast in the final shape or cut from a larger sheet. The double-stick tape 205 may be applied to either the carrier 105 or the desiccant 130, and the desiccant adhered to the carrier. Alternatively, where multiple desiccants are cast in a single sheet, the double-stick tape may be applied to the back of the sheet and the desiccant punched from the sheet.

Once the desiccant 130 is adhered to the carrier 105, the Kapton tape 210 may be applied over the capacitors. Alternatively, the Kapton tape 210 may be applied before the desiccant 130 is adhered to the carrier 105 and the desiccant, double-stick tape 205, and Kapton tape all applied to the carrier simultaneously. Next, the metal gasket 120 may be placed around the desiccant.

After the desiccant 130 and gasket 120 are in place, the inserts may be placed within the containment area and the TIM 140 may be applied to the chip 100. The presence of the desiccant and gasket may prevent the TIM from contacting capacitors, traces, metal films, or other electrical components with which the TIM should not come in contact, insofar as the desiccant may overlie these elements. Once the TIM 140 is applied, the heat sink 110 may be placed above the embodiment 200 and clamped or otherwise affixed to the carrier 105.

(A discussion of how the TIM is applied is given below.) It should be understood this is but one exemplary method of manufacture. The operations disclosed herein (or with respect to the following method of manufacture) may occur in a different order. Likewise, certain operations may be omitted, or other operations added, in alternative methods of manufacture.

It should be noted that the exact configuration of insert 125, gasket 120, desiccant 130 and so forth may vary between embodiments. Certain embodiments may change the cross-sectional thickness, configuration, area, or shape of any or all such elements. Accordingly, it should be understood that variations in the size, shape, configuration, or assembly procedure of any embodiment or any of the constituent parts are embraced by the present invention.

The assembly of another exemplary embodiment will now be discussed. The desiccant 130 is reset at some point prior to assembly. To reset the desiccant 130, it may be heated for a period of time. (The exact length of time for which the desiccant is heated may vary depending on the polymer and/or sieve used in the desiccant, the physical dimensions of the desiccant, and so forth.) Heating the desiccant serves to drive moisture and other compounds out of the desiccant.

An adhesive may be placed on the carrier 105 or insert 125. The insert 125 may then be attached to the carrier 105. In embodiments where the insert is omitted, the adhesive may be placed on the desiccant instead, which is in turn attached to the carrier. The locating feature(s) 155 formed on either the desiccant or insert may facilitate in properly placing the chip in the aperture.

After the insert 125 is affixed to the carrier 105, the gasket 120 may be placed around the insert. The gasket 120 may be sized to effectively snap-fit around the insert 125 for a snug fit. Additionally, the gasket may be adhered to the carrier 105 if desired. The vapor barrier 145 may be placed on and about the gasket either before or after the gasket is placed.

Once the gasket 120 and insert 125 are seated, the TIM 145 may be applied to an upper surface of the chip 100. The upper chip surface may be treated with a cleaning agent before the TIM is applied. For example, the upper chip surface may be cleaned of any oxidants. The cleaning agent may, for example, remove surface contamination, oils, certain oxides, and so forth. Generally, the cleaning agent removes contaminants that may interfere with the wetting of the TIM or its operation. At least the surface of the chip 100 to which the TIM is applied may be coated with a thin layer of adhesion-promoting material, such as a titanium, nickel, chrome or gold film, a silated promoter or an organic promoter such as an epoxy. (The film may likewise be a mixture of titanium and gold, a mixture of other suitable metals, or other unmixed metals.) The TIM 140 may be initially positioned approximately in the middle of the chip 100, especially if the TIM is liquid. In one manufacturing method, the liquid TIM may be applied with a dropper. Multiple heads may be employed in an assembly-line fashion to place TIM on multiple chips simultaneously. By positioning the liquid metal TIM initially in the middle of the chip, inadvertent spreading of the TIM off the chip may be minimized.

An ultrasonic wand may be used to vibrate and spread the TIM 140. Sonication of the TIM not only spreads the TIM across the chip surface, but additionally may break down deposits, voids, or clumps of particles within the TIM. This, in turn, may lead to a more even distribution of the TIM 140 across the chip surface. The ultrasonic wand may be moved across the TIM in a double orthogonal serpentine pattern to facilitate spreading the TIM completely across the chip surface. The wand may be affixed to a jig or other mechanical fixture to prevent the wand's tip from touching the chip 100, heat sink 110, or surface of the TIM 140. The jig may permit movement in three dimensions to facilitate motion of the wand across the TIM and thus spreading of the TIM.

Oftentimes, too much TIM 140 may be applied to the chip 100. The TIM layer may be thicker than desired, yielding excess TIM that may seep or migrate into containment areas relatively quickly. In some cases, the excess TIM may actually spill outside the containment area if too much TIM is present. The excess TIM may, for example, migrate between the heat sink and gasket or gasket and carrier. Accordingly, the thickness of the applied TIM 140 may be measured and a siphon may remove TIM until a desired thickness is reached.

Once the proper amount of TIM 140 is reached on a surface of the chip 100, oxides formed on the outer layer of the TIM may be removed. A trowel may contact and pass along the top of the TIM 140 layer, skimming and/or removing at least a portion of the layer. By removing this top TIM layer, oxide buildup on the TIM exterior may also be removed. Generally speaking, oxides formed on or in the TIM 140 may inhibit heat transfer between the chip and heat sink.

After the TIM 140 is applied to the chip 100, the heat sink 110 may be attached to the carrier 105.

The side of the heat sink 110 that will contact the TIM 140 may be treated with an adhesion-promoting layer. The adhesion-promoting layer may be, for example an RCA-1 type surface preparation, a silated promoter, or any form of actual adhesive. Further, the sink 110 may be plated with a metal or micro-roughened to promote adhesion. Such plating may be a complete plating of the surface, an evaporative coating, or a sputter-coating. The evaporative and sputter-coatings may be specific to particular areas of the heat sink or completely cover the surface. Exemplary metals for plating or coating the heat sink include nickel, chrome, titanium and other metals resistant to oxidation. An additional top coating of a noble metal (such as gold or platinum) may protect the aforementioned, first metal coating from oxidation. Such a top coating is generally overlaid on the first metal coating.

Alternatively (or additionally), a wetting layer may be added to the base of the heat sink 110 or top surface of the chip package 105. The wetting layer may be a chemical coating that promotes adhesion to the TIM 140 and/or uniform distribution of the TIM across the base of the heat sink. Exemplary wetting layers include a relatively oxide-free metal surface, such as a chrome-gold or titanium-gold alloy (or, alternatively, a gold layer atop a chrome or titanium layer). In such layers, the gold may minimize or prevent the formation of oxides. Once the wetting layer contacts the TIM, the gold is generally dissolved by the TIM and the underlying or second metal directly wetted by the TIM. It should be noted that both chrome and titanium generally have limited solubility with respect to most TIMs. Alternative metals, such as tantalum, may replace the chrome or titanium layer.

The wetting layer may enhance surface energy of the wetted portion of the sink/carrier. This, in turn, may enhance surface energy and therefore the adhesion of the TIM to the surface.

In a similar manner, the chip package 105 (or heat sink 110) may be treated to deplete or remove inorganic or organic compounds prior to attaching the embodiment thereto. For example, the chip package 105 may be ozonated, ashed, washed with hydrofluoric acid, or treated with an RCA-1 or RCA-2 type surface preparation. Further, plating the side of the chip package 105 adjacent the embodiment may minimize surface energy and thus minimize adhesion of the TIM 140 to portions of the carrier where such adhesion is generally undesirable. The chip package 105 may be plated with a metal such as gold, titanium, nickel, chromium, platinum, and so forth. It should be noted that multiple plating layers may be added to the chip package 105, and each such layer may be of a different metal.

Plating the chip package 105 in this manner may also minimize oxidation of the TIM and/or diffusion across the interface between the chip package and the TIM 140, particularly in the overflow areas 175. Plating may also seal the chip package and increase the performance of the gasket and vapor barrier.

Additionally, such plating may serve as a barrier layer to prevent the TIM 140 from diffusing into the chip package 105; the heat sink 110 may be plated in a similar manner. By preventing diffusion of the TIM 140, the formation of intermetallics may be reduced which might otherwise deplete certain components or constituents (such as gallium or indium) from the liquid metal TIM and move its composition away from the eutectic point. This could result in hardening of the TIM from a liquid into a solid. Intermetallics generally disrupt thermal transfer from the chip 100 to the heat sink 110.

The present embodiment may have a number of beneficial effects when integrated with a chip 100, chip package 105 and heat sink 110. For example and as explained generally herein, the presence of the embodiment and associated thermal interface material 140 may greatly minimize thermal resistance between the heat sink 110 and chip 100. Controlling the size of the interfaces between the chip and TIM, as well as the TIM and heat sink, may aid in minimizing thermal resistance. References herein to a "bond line thickness" generally refer to the distance between the chip's upper surface and heat sink's lower surface. In many embodiments, the bond line thickness is also the thickness of the TIM 140. The insert 125 or desiccant 130 may include one or more limit stops 177. The limit stops may project upwardly, downwardly, or in both directions from the body of the insert or desiccant. The upward and/or downward projection of the limit stops 177 may set the bond line thickness between chip 100 and heat sink 110, insofar as the limit stops 177 define the distance between the base of the heat sink and top of the chip. The limit stop or limit stops 177(and, for that matter, the locating features 155) may be formed integrally with the insert or desiccant, or may be separate elements. The limit stops may be located on any side of the aperture, insert or desiccant.

Additionally, by controlling the bond line thickness of the embodiment (for example, by using the height of the limit stops 177), the embodiment may maximize the co-planarity of the conduction area on the heat sink 110 relative to the corresponding surface of the chip package 105. This, in turn, may reduce the bending of the carrier and/or sink 110 resulting from an impact. Accordingly, the combination of the embodiment, heat sink 110, chip 100 and chip package 105 may be more stable over time; thus, the heat sink may misalign less often with respect to the chip and carrier. Reducing misalignment in this manner may minimize the likelihood that the carrier will crack, sag or break under pressure.

It should be understood that alternative embodiments of the present invention may omit certain elements disclosed herein, or may add additional elements not discussed herein. For example, an alternative embodiment may include a second seal or gasket placed about the first, or a different type of vapor barrier such as a tape. Yet other embodiments may split the insert or desiccant into multiple pieces. Accordingly, the proper scope of the invention is defined by the appended claims.

We claim:
1. An apparatus for containing at least one semiconductor element, comprising:
a containment element operative to define a containment area at least partially containing the semiconductor element;
an insert adjacent the containment element and operative to set a distance between the containment element and the computing element;
a desiccant contained within the containment element; and
a thermal interface material adjacent the semiconductor element.
2. The apparatus of claim 1, wherein the thermal interface material is placed within the containment element.
3. The apparatus of claim 2, wherein the thermal interface material is placed adjacent the semiconductor element.
4. The apparatus of claim 1, wherein the containment element is a gasket.
5. The apparatus of claim 4, wherein the gasket comprises a metal.
6. The apparatus of claim 5, wherein the metal is chosen from the group comprising nickel, steel, brass, molybdenum and gold.
7. The apparatus of claim 5, wherein the gasket comprises:
a sidewall;
a first arm extending outwardly from the sidewall and away from the containment area; and
a second arm extending outwardly from the sidewall and away from the containment area.
8. The apparatus of claim 7, wherein:
the gasket is C-shaped in vertical cross-section; and
the first arm and second arm are at least partially substantially parallel to one another.
9. The apparatus of claim 5, wherein the gasket comprises:
a sidewall;
a first arm extending inwardly from the sidewall and into the containment area; and
a second arm extending inwardly from the sidewall and into the containment area.
10. The apparatus of claim 9, wherein:
the sidewall defines an outer boundary of the gasket; and
the first arm and second arm are at least partially substantially parallel to one another.
11. The apparatus of claim 5, further comprising a vapor barrier adjacent the gasket.
12. The apparatus of claim 11, wherein the vapor barrier is a grease.
13. The apparatus of claim 12, wherein the vapor barrier is a grease.
14. The apparatus of claim 4, wherein the gasket comprises:
a base material chosen from the group comprising rubber, plastic and metal; and
a metal overlying and substantially enclosing the base material.
15. The apparatus of claim 1, wherein the semiconductor element is a processor.
16. An apparatus for transferring heat from a computing element to a heat sink, comprising:
a gasket defining a containment area within the gasket;
a vapor barrier at least partially spread across the gasket;
an insert positioned within the containment area and adjacent the gasket, the insert defining an aperture;
a desiccant positioned within the containment area; and
a thermal interface material positioned within the containment area; wherein the desiccant comprises a mixture of a polymer and a molecular sieve; and the desiccant is a solid unitary piece.

17. The apparatus of claim 16, wherein the insert comprises the desiccant.

18. The apparatus of claim 17, wherein the entirety of the insert is the desiccant.

19. The apparatus of claim 16, further comprising:

a computing element received in the aperture; wherein the thermal interface material abuts at least a portion of the computing element.

20. The apparatus of claim 19, further comprising a locating feature projecting into the aperture, the locating feature abutting the computing element and operative to align the gasket with respect to the computing element in an X-Y plane.

21. The apparatus of claim 20, further comprising a limit stop projecting upwardly and downwardly from the insert.

22. The apparatus of claim 21, further comprising a heat sink abutting the limit stop.

23. The apparatus of claim 22, wherein the thermal interface material further abuts at least a portion of the heat sink.

24. The apparatus of claim 23, wherein the thermal interface material may be a liquid.

25. The apparatus of claim 24, wherein the thermal interface material comprises a mixture of gallium, indium and tin.

26. The apparatus of claim 24, wherein the thermal interface material comprises a mixture of diamond and titanium particles.

27. An apparatus for transferring heat from a computing element to a heat sink, comprising:

A gasket defining a containment area within the gasket;

a vapor barrier at least partially spread across the gasket;

an insert positioned within the containment area and adjacent the gasket, the insert defining an aperture;

a desiccant positioned within the containment area; and a thermal interface material positioned within the containment area; wherein the gasket is formed from a metal; and the gasket is C-shaped in vertical cross-section.

28. A barrier for use with a thermal interface material, comprising:

a gasket comprising:

a sidewall having a first end and a second end;

a first leg extending from the first end of the sidewall;

a second leg extending from the second end of the sidewall; wherein the sidewall, first leg, and second leg are at least partially formed from a first metal;

the sidewall, first leg, and second leg form a C-shape;

the gasket defines a containment area for the thermal interface material; and the sidewall, first leg, and second leg are formed from a first material and covered by the first metal.

29. the barrier of claim 28, wherein the gasket is round.

30. The barrier of claim 29, wherein the gasket is substantially square.

31. The barrier of claim 28, wherein the first leg and second leg extend outwardly from the sidewall and away from a containment area defined by the sidewall.

32. The barrier of claim 28, wherein the first leg and second leg extend inwardly from the sidewall towards a center of the gasket.

33. The barrier of claim 28, wherein the first material is chosen from the group comprising a plastic, a rubber, and a second metal.

34. The barrier of claim 28, wherein the first metal is electroplated on the first material.

35. The barrier of claim 34, further comprising a vapor barrier at least partially coating the gasket.

36. The barrier of claim 35, wherein the vapor barrier is chosen from the group comprising: a moisture-impermeable grease, indium, gold and copper.

37. The barrier of claim 35, wherein the vapor barrier is a gas-impermeable grease.

38. An apparatus for containing at least one semiconductor element, comprising:

a containment element operative to define a containment area at least partially containing the semiconductor element;

an insert adjacent the containment element and operative to set a distance between the containment element and the semiconductor element;

a desiccant contained within the containment element; wherein the semiconductor element defines at least a portion of a second containment area that contains the desiccant.

* * * * *

UNITED STATES PATENT AND TRADEMARK OFFICE
CERTIFICATE OF CORRECTION

| | |
|---|---|
| PATENT NO. | : 7,440,281 B2 |
| APPLICATION NO. | : 11/344657 |
| DATED | : October 21, 2008 |
| INVENTOR(S) | : Sean Ashley Bailey et al. |

Page 1 of 1

It is certified that error appears in the above-identified patent and that said Letters Patent is hereby corrected as shown below:

In column 14, at line 9, delete "computing" and insert --semiconductor--.

Signed and Sealed this

Twenty-third Day of December, 2008

JON W. DUDAS
*Director of the United States Patent and Trademark Office*